(12) United States Patent
Nakamura et al.

(10) Patent No.: US 10,469,080 B2
(45) Date of Patent: *Nov. 5, 2019

(54) OPERATION UNIT AND ELECTRONIC EQUIPMENT HAVING THE SAME

(71) Applicant: Sharp Kabushiki Kaisha, Osaka (JP)

(72) Inventors: Yasushi Nakamura, Osaka (JP); Osamu Kawata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/278,059

(22) Filed: Feb. 16, 2019

(65) Prior Publication Data

US 2019/0181861 A1 Jun. 13, 2019

Related U.S. Application Data

(63) Continuation of application No. 15/296,268, filed on Oct. 18, 2016, now Pat. No. 10,243,556.

(30) Foreign Application Priority Data

Oct. 20, 2015 (JP) ................................. 2015-206357

(51) Int. Cl.
 *H03K 17/96* (2006.01)
 *G06F 3/041* (2006.01)
 *H04N 1/00* (2006.01)

(52) U.S. Cl.
 CPC ......... *H03K 17/9622* (2013.01); *G06F 3/041* (2013.01); *H03K 2217/960785* (2013.01)

(58) Field of Classification Search
 CPC .... H03K 17/9622; H03K 2217/960785; G06F 3/041
 See application file for complete search history.

(56) References Cited

U.S. PATENT DOCUMENTS

2006/0132458 A1* 6/2006 Garfio ................... G06F 1/1626
 345/173
2007/0295588 A1 12/2007 Kamata
 (Continued)

FOREIGN PATENT DOCUMENTS

CN 101006538 A 7/2007
CN 101252050 A 8/2008
 (Continued)

OTHER PUBLICATIONS

Allowed Claims from Parent U.S. Appl. No. 15/296,268, filed Oct. 18, 2016.

*Primary Examiner* — Mary Ellen Bowman
(74) *Attorney, Agent, or Firm* — Renner, Otto, Boisselle & Sklar, LLP

(57) ABSTRACT

An operation unit comprises a touch panel display, a home key and a power saving key. The power saving key includes an indication portion, and a first indication portion out of the indication portion has light permeability, and a color of its surface is a dark color, and a second indication portion has no light permeability or has it hardly, which is constituted by a double-layered print. In a surface side of this second indication portion, a figure indicative of a power saving key is printed in silver ink, and in a rear side thereof, a figure indicative of the power saving key is printed in black ink. In a normal state, when a backlight is lit, a surface of the first indication portion is bright, and a surface of the second indication portion is darker than the surface of the first indication portion. On the other hand, in a power saving mode, when a light guide plate does not emit light, the surface of the first indication portion is dark, and the surface of the second indication portion is brighter than the surface of the first indication portion. Therefore, presence and (Continued)

location of the power saving key can be notified in a visible manner.

9 Claims, 9 Drawing Sheets

(56) References Cited

U.S. PATENT DOCUMENTS

| | | | |
|---|---|---|---|
| 2008/0206521 A1 | 8/2008 | Hosaka | |
| 2013/0058128 A1* | 3/2013 | Cho | G06F 1/1626 362/602 |
| 2015/0242026 A1* | 8/2015 | Nakamura | H04N 1/00384 345/174 |

FOREIGN PATENT DOCUMENTS

| | | | | |
|---|---|---|---|---|
| CN | 103107038 A | 5/2013 | | |
| JP | S62-274512 | 11/1987 | | |
| JP | 2014-112353 A | 6/2014 | | |
| WO | WO-2015105231 A1 * | 7/2015 | ......... | H03K 17/9629 |

* cited by examiner

PERSPECTIVE VIEW (DISMOUNTED STATE)

PERSPECTIVE VIEW (MOUNTED STATE)

TOP VIEW

CROSS-SECTIONAL VIEW

PRINT (POWER SAVING FIGURE)

PRINT (LIGHT PERMEATION PREVENTING MEMBER)

SECOND OPERATING REGION R2

CROSS-SECTIONAL VIEW

US 10,469,080 B2

OPERATION UNIT AND ELECTRONIC EQUIPMENT HAVING THE SAME

CROSS REFERENCE OF RELATED APPLICATION

This is a continuation under 35 USC § 120 of U.S. application Ser. No. 15/296,268, filed on Oct. 18, 2016, the entire disclosure of which is incorporated herein by reference.

The disclosure of Japanese patent application No. 2015-206357 filed on Oct. 20, 2015 is incorporated by reference.

BACKGROUND OF THE INVENTION

Field of the Invention

The present invention relates to an operation unit and electronic equipment having the same, and more specifically, an operation unit that a touch operation can be performed, and electronic equipment having the same.

Description of the Related Art

An example of the related art is disclosed in Japanese patent application laying-open No. 2014-112353 [G06F 3/02, H01H 13/02, H03M 11/04, G06F 3/023, G06F 3/041] laid-open on Jun. 19, 2014 (Literature 1). An operation device of the literature 1 includes a touch key that a touch operation can be performed, and this touch key comprises a circuit board that is mounted with a light source, a transparent portion that transmits light, an opaque light shielding portion, and a semitransparent operating panel that covers upper surfaces of the transparent portion and the light shielding portion. The transparent portion accommodates the light source, and planes that the transparent portion and the light shielding portion are adjacent with each other are adhered closely, and the circuit board and the light shielding portion cover the transparent portion so that light is emitted from only a plane that is brought into contact with the operating panel.

However, in the operation device disclosed in the literature 1, since a touch panel is formed by polycarbonate with a smoked tone, when the light source is put out in a power saving state, entire home key becomes dark and thus it is hard to see a figure indicative of a touch key such as the home key. If applying such a touch key to a key (energy saving key) for setting an image forming apparatus to a power saving state from a normal state and for returning the image forming apparatus to the normal state from the power saving state, since it is difficult to see the figure indicative of the energy saving key, there is a problem that it is difficult to operate the energy saving key when returning the image forming apparatus to the normal state from the power saving state.

SUMMARY OF THE INVENTION

Therefore, it is a primary object of the present invention to provide a novel operation unit and electronic equipment having the same.

It is another object of the present invention to provide an operation unit capable of improve operability, and electronic equipment having the same.

A first invention is an operation unit, comprising: an indication portion that includes a first indication portion having light permeability and a second indication portion laminated on the first indication portion; and an operating portion including the indication portion. In this operation unit, it is constituted so that a surface of the second indication portion is brighter than brightness of a surface of the first indication portion. That is, the brightness of the first indication portion and the brightness of the second indication portion are different from each other.

According to the first invention, it is possible to visually recognize the second indication portion easily. Therefore, it is possible to improve operability.

A second invention is the operation unit according to the first invention, wherein the operating portion includes a light emitter that is arranged facing a rear surface of the indication portion, and the surface of the second indication portion is made darker than the brightness of the surface of the first indication portion in a case where the indication portion is illuminated by the light emitter. That is, light and darkness of the first indication portion and the second indication portion are reversed in a case where the indication portion is illuminated by the light emitter or in a case where the indication portion is not illuminated.

According to the second invention, it is possible to visually recognize the second indication portion easily irrespective of whether the indication portion is illuminated by the light emitter or not.

A third invention is the operation unit according to the first invention, wherein a color of the first indication portion is a dark color. The color of the first indication portion is black or brown, for example.

A fourth invention is the operation unit according to the first invention, wherein a color of the second indication portion is a metallic color or a color that approximates to the metallic color.

A fifth invention is the operation unit according to the fourth invention, wherein the color of the second indication portion is silver.

A sixth invention is the operation unit according to the first invention, wherein a color of a rear surface side of the second indication portion is black.

According to the sixth invention, even if the indication portion is illuminated by the light emitter, the second indication portion does not permeate light or hardly permeate light.

A seventh invention is the operation unit according to the first invention, further comprising a light permeation preventing member that is provided in a rear surface side of the indication portion and prevents light irradiated by the light emitter from being permeated around the indication portion.

According to the seventh invention, it is possible to prevent, by the light permeation preventing member, circumference of the indication portion from becoming bright.

An eighth invention is the operation unit according to the first invention, wherein a surface of the operation unit including a surface of the indication portion includes a smooth region having a smooth surface and an uneven region having an uneven surface.

According to the eighth invention, it is possible to prevent, by the uneven surface, dirt, such as a user's finger marks, from adhering.

A ninth invention is the operation unit according to the eighth invention, wherein at least a part of the surface of the indication portion is included in the uneven region. Therefore, for example, if a finger is moved along a boundary of the smooth surface and the uneven surface, the user can touch the indication portion without seeing the surface of the operation unit.

According to the ninth invention, it is possible to improve operability more.

A tenth invention is the operation unit according to the eighth invention, further comprising a further operating portion that is distinguishable over the operating portion, wherein unevenness of the uneven region is formed in a shape of ripples centered around the further operating portion.

According to the tenth invention, it is possible to, by the ripples, visually recognize the further operating portion and recognize the further operating portion by a tactile sense by touching with a finger.

An eleventh invention is an operation unit, comprising: an indication portion; and an operating portion that includes the indication portion, wherein a surface of the operation unit that includes a surface of the operating portion comprises a smooth region having a smooth surface and an uneven region having an uneven surface.

According also to the eleventh invention, it is possible to prevent, by the uneven surface, dirt, such as a user's finger marks, from adhering.

A twelfth invention is the operation unit according to the eleventh invention, wherein at least a part of the surface of the indication portion is included in the uneven area. Therefore, for example, if a finger is moved along a boundary of the smooth surface and the uneven surface, the user can touch the indication portion without seeing the surface of the operation unit.

According to the twelfth invention, it is possible to improve operability more.

A thirteenth invention is the operation unit according to the eleventh invention, further comprising a further operating portion that is distinguishable over the operating portion, wherein unevenness of the uneven area is formed in a shape of ripples centered around the further operating portion.

According to the thirteenth invention, it is possible to, by the ripples, visually recognize the further operating portion and recognize the further operating portion by a tactile sense by touching with a finger.

A fourteenth invention is electronic equipment comprising the operation unit according to in the first invention.

A fifteenth invention is electronic equipment comprising the operation unit according to the eleventh invention.

The above mentioned objects and other objects, features, aspects and advantages of the present invention will become more apparent from the following detailed description of the present invention when taken in conjunction with the accompanying drawings.

DETAILED DESCRIPTION OF NON-LIMITING EXAMPLE EMBODIMENTS

First Embodiment

Figure 1:
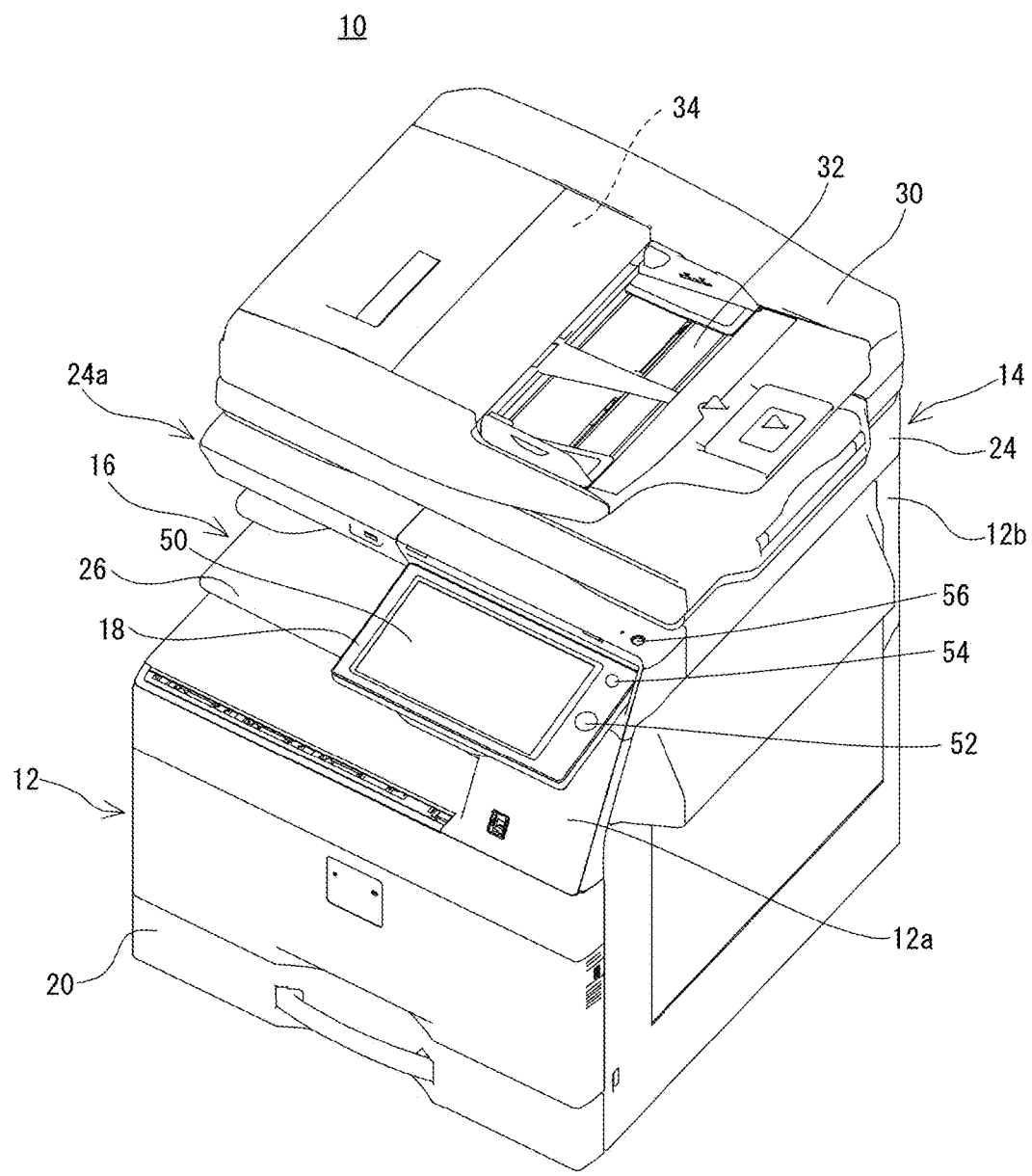
FIG. 1 is a perspective view showing an example of an appearance configuration of an image forming apparatus that is an embodiment according to the present invention, as viewed obliquely above.
Figure 2:
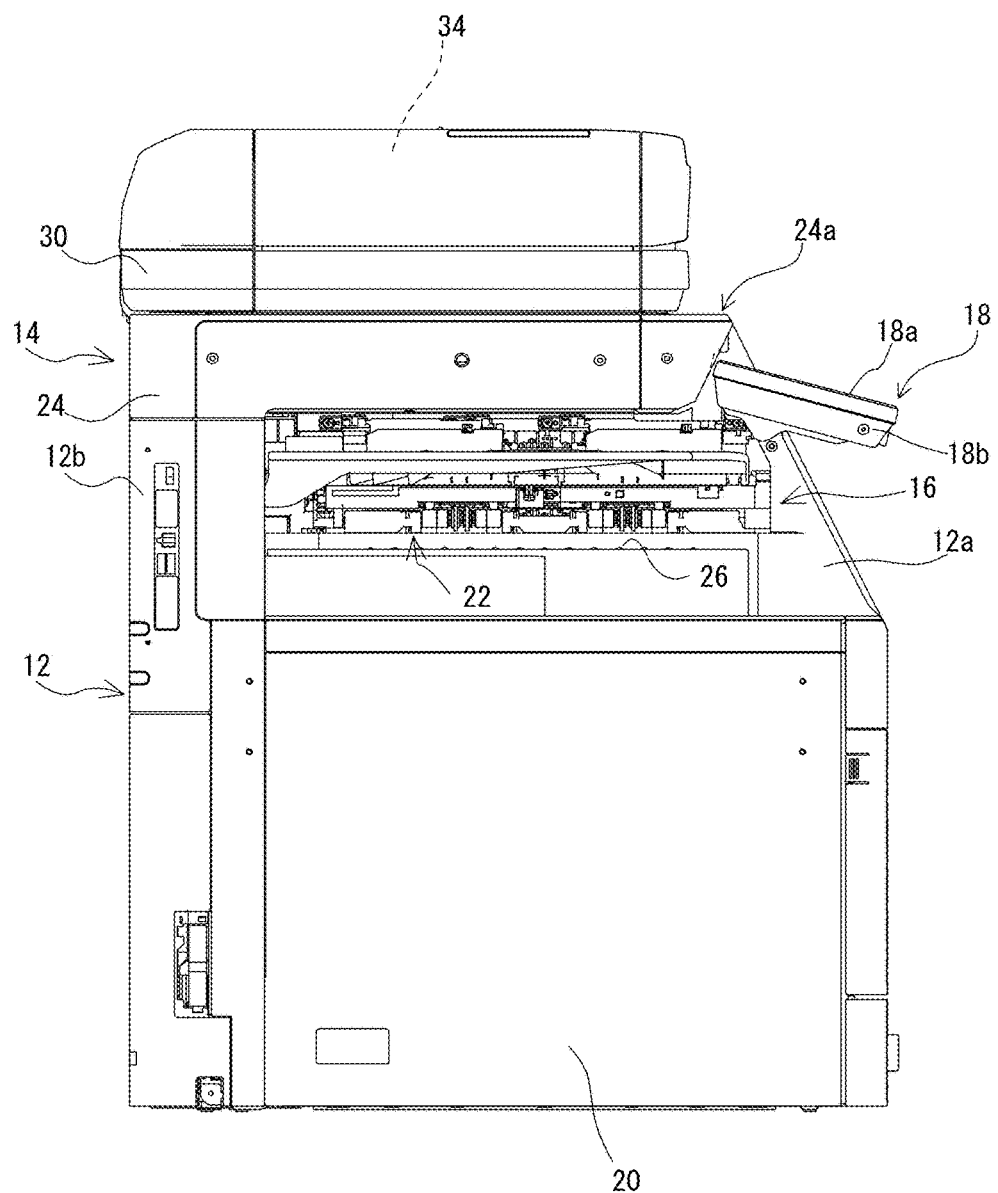
FIG. 2 is a side view of the image forming apparatus shown in FIG. 1, as viewed from a left side surface.

FIG. 1 is a perspective view viewing obliquely above an example of an appearance configuration of an image forming apparatus 10 according to a first embodiment. FIG. 2 is a side view that the image forming apparatus 10 shown in FIG. 1 is viewed from a left side surface.

With reference to FIG. 1, an image forming apparatus 10 that is an embodiment according to the present invention is an image forming apparatus of an in-barrel sheet discharge type that an in-barrel sheet discharge portion 16 is formed between an image forming portion 12 and an image reading portion 14, and the image forming apparatus 10 comprises an operation unit 18 that is provided as a separate unit in a front side of the image reading portion 14. As described later, the image forming apparatus 10 forms, based on image data etc. read by the image reading portion 14, a multicolor or monochromatic image to a predetermined sheet (recording medium), and discharges the sheet having been formed with the image to the in-barrel sheet discharge portion 16. In the first embodiment, the image forming apparatus 10 is a multifunction peripheral (MFP) that has a copying function, a printer function, a scanner function, a facsimile function, etc.

In addition, in this specification, a front-back direction (a depth direction) as for the image forming apparatus 10 and its structural members is defined on the assumption that a surface opposite to a standing position of a user, i.e., a surface in a side provided with the operation unit 18 is a front surface (a front side), and a left-right direction (a lateral direction) as for the image forming apparatus 10 and its structural members is defined on the basis of a state where the image forming apparatus 10 is viewed from the user.

First, basic structure of the image forming apparatus 10 will be described. As shown in FIG. 1 and FIG. 2, the image forming apparatus 10 comprises the image forming portion 12 and the image reading portion 14 provided above the image forming portion 12.

A housing of the image forming portion 12 includes a first coupling housing 12a formed in a right side upper part and a second coupling housing 12b formed in a back side upper part, and the image reading portion 14 is supported by these first coupling housing 12a and the second coupling housing 12b. Accordingly, the in-barrel sheet discharge portion 16 that is an in-barrel space where sheets each having been formed with an image are stored is formed in an undersurface side of the image reading portion 14.

The image forming portion 12 comprises an exposure unit, a developer, a photoreceptor drum, a charger, an intermediate transfer belt, a transfer roller, a fixing unit, etc. The image forming portion 12 forms an image with an electro-photographic system onto a sheet that is fed from a sheet cassette 20 etc. arranged below. More specifically, the image forming portion 12 forms an electrostatic latent image according to image data on the photoreceptor drum by the charger, the exposure unit, etc., and visualizes the electrostatic latent image on the photoreceptor drum with a toner by the developer. Furthermore, a toner image formed on the photoreceptor drum is transferred onto the sheet by the intermediate transfer belt, the transfer roller, etc., and the toner image transferred to the sheet is thermally fixed by the fixing unit. Subsequently, the sheet having been formed with an image is discharged from a discharge port 22 that is formed on the first coupling housing 12a to the in-barrel sheet discharge portion 16. In addition, image data for forming an image on a sheet may be image data that is read by the image reading portion 14, image data that is transmitted from an external computer, etc.

The image reading portion 14 comprises a housing 24 that has a document placing table that is formed of transparent material on its upper surface. In this housing 24, a light source, a plurality of mirrors, a focusing lens, a line sensor, etc. are provided. The image reading portion 14 exposes a document surface by the light source, and leads a reflection light reflected from the document surface to the focusing lens by the plurality of mirrors. Then, the reflection light is focused onto light receiving elements of the line sensor by the focusing lens. In the line sensor, the brightness and chromaticity of the reflection light that is focused on the light receiving elements are detected, and image data based on the image on the document surface is produced. As the line sensor, a CCD (Charge Coupled Device) or a CIS (Contact Image Sensor) is used.

As for the in-barrel sheet discharge portion 16, a bottom surface and a top surface are partitioned with the housing of the image forming portion 12 and the housing 24 of the image reading portion 14, respectively, and a right side surface and a back side surface are partitioned with the first coupling housing 12a and the second coupling housing 12b. That is, a front side and a left side of the in-barrel sheet discharge portion 16 are opened. Furthermore, the in-barrel sheet discharge portion 16 is provided with a discharge tray 26 for receiving the sheet that is formed with the image and discharged from the discharge port 22.

Furthermore, a document pressing cover 30 is openably attached to the upper surface of the image reading portion 14 via a hinge etc. being arranged in a back side. This document pressing cover 30 is provided with an ADF (automatic document feeder) 34 that automatically feeds a document placed on a document placing tray 32 to an image reading position in the image reading portion 14 one by one.

Moreover, the housing 24 of the image reading portion 14 has a housing projection portion 24a that is projected frontward as compared with a front surface of the document pressing cover 30. That is, a front end portion of the housing 24 is projected frontward as compared with the front surface of the document pressing cover 30. Then, the operation unit 18 is provided in a front side of the housing 24 of this image reading portion 14. A main power button 56 is provided on an upper surface of the housing projection portion 24a (housing 24) in a right end portion of the housing 24. In this first embodiment, this main power button 56 is arranged in a position on a line with a home key 52 and a power saving key 54 both described later when viewing the image forming apparatus 10 from the front. Furthermore, the main power button 56 is a hardware key of a push button type.

Furthermore, although illustration is omitted, a control portion that controls operations or actions respective components or portions of the image forming apparatus 10 is provided in a predetermined position of the image forming apparatus 10. The control portion comprises a CPU, a memory, a communication module, etc., and transmits control signals to respective components or portions of the image forming apparatus 10 according to an input operation to the operation unit 18 by the user so as to make the image forming apparatus 10 perform various kinds of operations or actions, and transmit and receive data to or from apparatuses being connected in a communicable manner.

Figure 3:
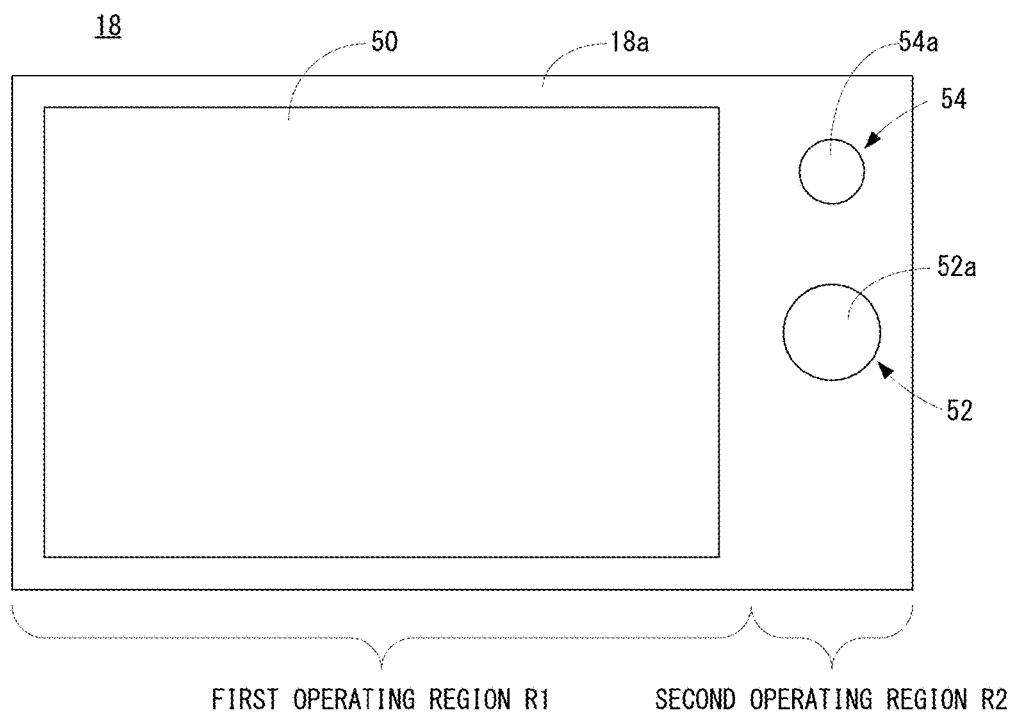
FIG. 3 is a top view of an example of structure of an operation unit, as viewed from the top.

FIG. 3 is an illustration figure for explaining the operating portion that is provided in the operation unit 18. The operation unit 18 is called an operation device or an operation panel, and is formed in a shape of an oblong rectangular plate. This operation unit 18 is provided to be inclined front-downwardly so that a user can easily see its upper surface (upper surface of operation panel). However, the operation unit 18 is attached to the housing of the image reading portion 14 rotatably around its upper end portion as a rotation axis.

A touch panel display 50, the home key 52 and the power saving key 54 are provided in the upper surface of the operation unit 18, and the home key 52 and the power saving key 54 are provided in a right of the touch panel display 50 while being aligned in a depth (vertical) direction. In this first embodiment, a region where the touch panel display 50 is provided in the upper surface of the operation unit 18 may be called a first operating region R1, and a region where the home key 52 and the power saving key 54 are provided and except for the first operating region R1 may be called a second operating region R2.

As shown in FIG. 2, the operation unit 18 includes a housing 18b that accommodates electric parts (components) of the operation unit 18, including a panel member 18a constituting the upper surface and the touch panel display 50. The panel member 18a is provided so as to close an opening of the housing 18b. However, a display portion and an operating portion (touch operation portion) of the touch panel display 50 are provided so as to be exposed from the opening (1802, 1822: see FIGS. 4(A) and 4(B)) of the panel member 18a.

The touch panel display 50 is a touch panel integral type liquid crystal display that is constituted by laminating a piezoelectric sensor etc. on a liquid crystal display panel, and is provided over approximately entire surface except for a peripheral portion of the upper surface of the operation unit 18. On this touch panel display 50, images of software keys for receiving various setting instructions, printing instructions, etc. from a user, a scanned image (preview image), an image (input image) received (acquired) from an external computer or a storage medium, various kinds of messages, etc. are displayed.

In addition, as a touch panel, it is possible to use not only a surface acoustic wave system using the piezoelectric sensor but ones of other systems, such as an electrostatic capacitance system, a resistance film system, an electromagnetic induction system, an infrared system, etc.

Each of the home key 52 and the power saving key 54 is a hardware key (an operating switch or operating key) using a switch of an electrostatic capacitance system. The home key 52 is a key for displaying a home screen on the touch panel display 50. In addition, the home screen is a screen (basic screen) displaying a main menu, and images of keys for selecting each of functions of copying, printing, facsimile (fax) and scan, and images of keys for displaying a setting screen about each of the functions.

As shown in FIG. 3, for example, the home key 52 is arranged in a center portion in a short-sided direction of the upper surface of the operation unit 18. Furthermore, an operating portion (operating surface) or indication portion (hereinafter, called "indication portion") 52a of the home key 52 is wider (larger) than an operating portion (operating surface) or indication portion (hereinafter, called "indication portion") 54a of the power saving key 54. This is because the home key 52 has high operation frequency compared with the power saving key 54.

The power saving key 54 is a key for shifting (setting) the image forming apparatus 10 to a power saving state (power saving mode) from a normal state (normal mode), or for shifting (returning) to the normal state from the power saving state. Here, the power saving state is a state where power supply to the components of the image forming apparatus 10 except for the CPU and the communication module is turned off (stopped), whereby power consumption of the image forming apparatus 10 can be suppressed to a predetermined value or less. However, if the main power supply is turned off, the power supply to all the components including the CPU and the communication module is stopped. Furthermore, if the main power supply is turned on, the power supply to all the components is turned on (started). This state is in the normal state (normal mode) of the image forming apparatus 10. For example, the power saving key 54 is arranged in a deeper side of the home key 52 on the upper surface of the operation unit 18. Furthermore, the indication portion 54a of the power saving key 54 is narrower (smaller) than the indication portion 52a of the home key 52. This is because the power saving key 54 has low operation frequency compared with the home key 52, and is for preventing an erroneous operation.

In addition, the main power supply of the image forming apparatus 10 is turned on or off by turning on or off the main power button 56.

Figure 4A:
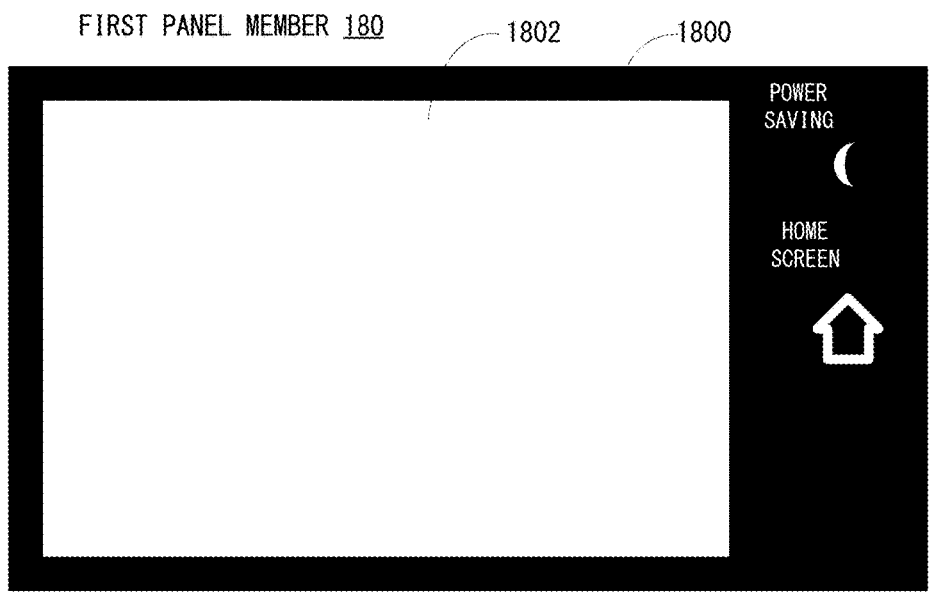
FIG. 4(A) is a top view of a first panel member constituting a panel member of the operation unit, as viewed from the top.
Figure 4B:
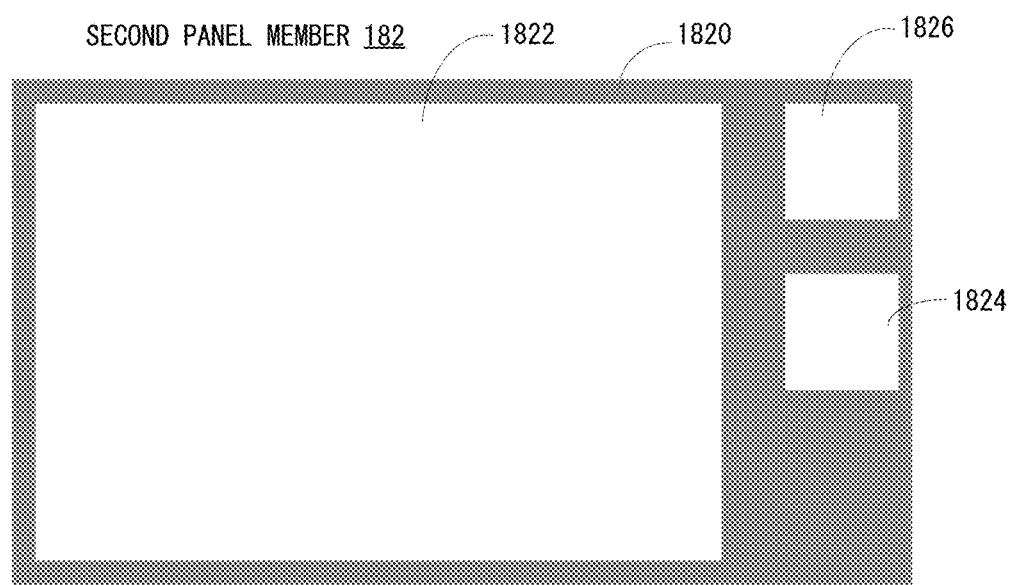
FIG. 4(B) is a top view of a second panel member constituting the panel member of the operation unit, as viewed from the top.

FIG. 4(A) is a top view of a first panel member 180 constituting the panel member 18a of the operation unit 18, as viewed from the top, and FIG. 4(B) is a top view of a second panel member 182 constituting the panel member 18a of the operation unit 18, as viewed from the top.

The panel member 18a is constituted by two layers, the first panel member 180 and the second panel member 182, and the first panel member 180 is provided so as to cover the second panel member 182. A surface of the first panel member 180 constitutes an upper surface of the panel member 18a (operation unit 18), and is a smooth surface.

As shown in FIG. 4(A), the first panel member 180 includes a frame 1800 that is formed by a resin such as polycarbonate. However, the frame 1800 may be formed with glass instead of a resin like polycarbonate. The frame 1800 is formed with an opening 1802 having the same or approximately the same size as the display portion and the operating portion of the touch panel display 50.

Furthermore, colorant is dispersed in the frame 1800 except for a portion thereof, and its surface is a dark color (black or brown, for example). That is, the frame 1800 is made to be semitransparency that permeability of visible light is low. The portion that no colorant is dispersed is a portion for indicating a figure (pattern) of the home key 52, and is made to be colorless transparent or colorless semitransparent. However, the frame 1800 has the light permeability of a certain degree with respect to light having predetermined luminance or more.

Furthermore, the character strings showing the home key 52 and the power saving key 54, respectively are printed in white on the surface of the frame 1800. In this first embodiment, the character string each showing each key is displayed (printed) an area upper left of each key.

Moreover, on a first indication portion 540 constituting the indication portion 54a of the power saving key 54, a second indication portion 542 that shows a figure (pattern) indicative of the power saving key 54 concerned is provided (printed). This second indication portion 542 has no light permeability that the light passes through or has light permeability hardly, as described later.

Although it is unclear in the drawing, each of the indication portion 52a of the home key 52 and the indication portion 54a of the power saving key 54 is formed in a shape of earthenware mortar-like recess being recessed on the rear side.

As shown in FIG. 4(B), the second panel member 182 includes a frame 1820 that is formed by a resin such as polycarbonate. The frame 1820 is formed with an opening 1822 having the same or approximately the same size as the display portion and the operating portion of the touch panel display 50. Furthermore, colorant is intermingled in the frame 1820 that is entirely a dark color like gray. Therefore, the frame 1820 has no light permeability capable of passing through light, or has light permeability hardly. Although it is unclear in the drawing, since the second panel member 182 is fitted into the first panel member 180 so as to overlap with it, the frame 1820 is smaller than the frame 1800 by thickness of the frame 1800.

Furthermore, openings 1824 and 1826 each rectangular shape are formed on the frame 1820 in right of the opening 1822 while being aligned in the depth direction. The openings 1824 and 1826 are formed mainly in order to irradiate a backlight to the home key 52 and the power saving key 54.

Figure 5A:
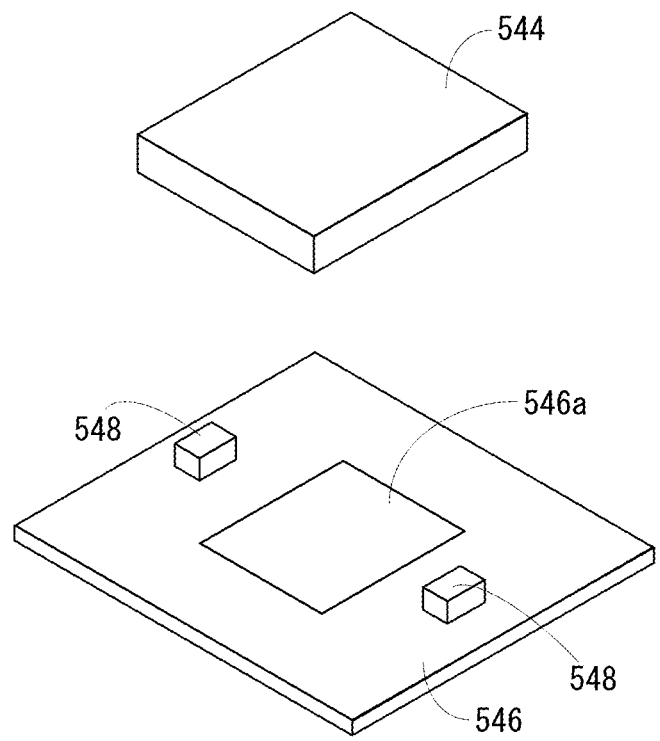
FIG. 5(A) is a perspective view showing respective appearance configurations of a light guide plate, a circuit board and LEDs, as viewed from obliquely above.
Figure 5B:
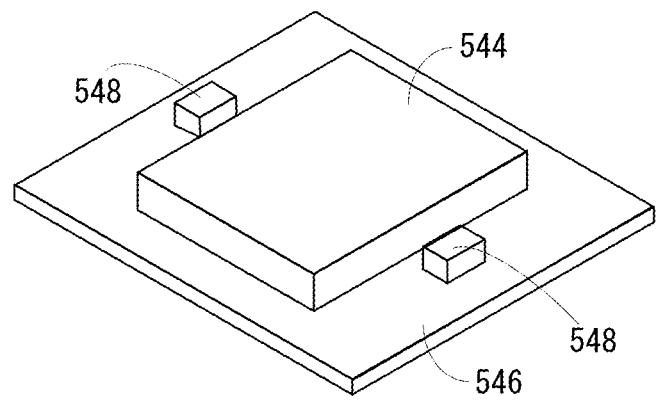
FIG. 5(B) is an illustration view showing a state where the light guide plate is mounted on the circuit board shown in FIG. 5(A).
Figure 6A:
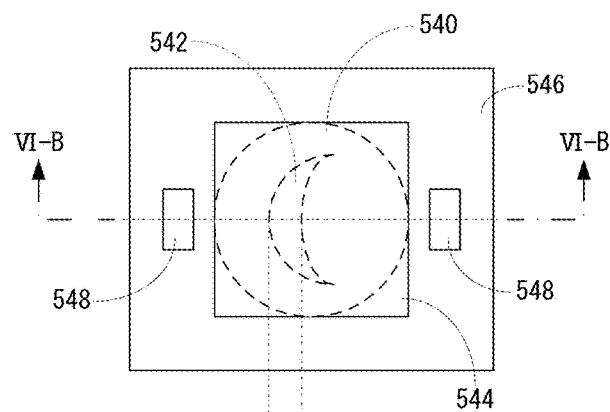
FIG. 6(A) is a top view of the state where the light guide plate is mounted on the circuit board, as viewed from the top.
Figure 6B:
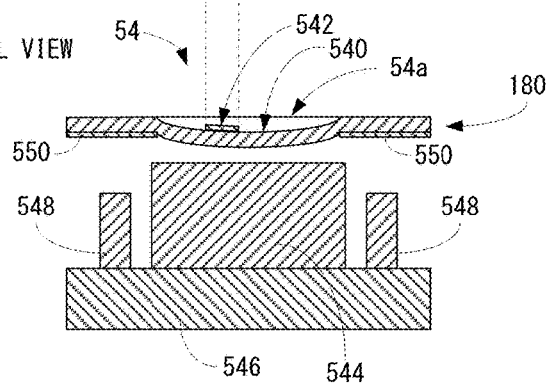
FIG. 6(B) is a cross-sectional view showing a part of first panel member, the light guide plate, the circuit board and the LEDs, when cutting the operation unit at a position shown by a VIB-VIB line in FIG. 6(A)

Although illustration is omitted, there is formed, near the openings 1824 and 1826 in a rear surface side of the frame 1820, with a mechanism for mounting components such as a light guide plate 544 (see FIGS. 5(A), 5(B) and FIG. 6(B)) that functions a light emitter, etc. However, this mechanism may be provided in a side of the housing 18b.

FIG. 5(A) is a perspective view viewing respective appearance configurations of the light guide plate 544, a circuit board 546 and two LEDs 548 from obliquely above, and FIG. 5(B) is an illustration view showing a state where the light guide plate 544 is mounted on the circuit board 546 shown in FIG. 5(A).

As shown in FIG. 5(A), the light guide plate 544 is formed in a shape of flat plate with a predetermined thickness. Although illustration is omitted, unevenness is formed in a bottom surface of the light guide plate 544, thereby to reflect upward the light that is irradiated from a side surface by each of the LEDs 548 described later. That is, the circuit board 546, the light guide plate 544 and the LED 548 function as a backlight for the home key 52 and the power saving key 54. The circuit board 546 is formed in a shape of flat plate having a plane slightly larger than that of the light guide plate 544, and is provided, in a center portion of the upper surface thereof, with electrodes (not shown) constituting a switch of the electrostatic capacitance system within a range of an area 546a. The switch of the electrostatic capacitance system is turned on or off according to change of the electrostatic capacitance between the electrodes, and is provided with a detecting circuit that detects the change of the electrostatic capacitance between the electrodes. Furthermore, the two LEDs 548 are mounted on the upper surface of the circuit board 546 so as to sandwich the area 546a so that irradiating surfaces thereof face each other. A distance (interval) between the two LEDs 548 is set up the same or approximately the same as a width of the light guide plate 544.

Therefore, as shown in FIG. 5(B), the light guide plate 544 is mounted on the circuit board 546 in a position where the area 546a is provided. At this time, the light guide plate 544 is sandwiched by the two LEDs 548. In a state where the light guide plate 544 is thus mounted on the circuit board 546, the light guide plate 544 and the circuit board 546 are attached to a rear surface of the first panel member 180 so that an upper surface of the light guide plate 544 is closed to a rear surface of the indication portion 54a of the power saving key 54 (see FIG. 6(B)). As to the home key 52, similarly, the light guide plate 544 and the circuit board 546 are attached to the rear surface of the first panel member 180 so that the upper surface of the light guide plate 544 is closed to a rear surface of the indication portion 52a.

Figure 6C:
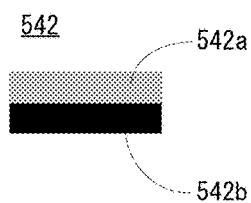
FIG. 6(C) is an illustration view showing a print of a portion of a figure indicative of a power saving key.
Figure 6D:
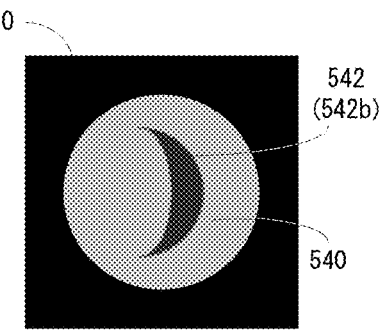
FIG. 6(D) is an illustration view showing an indication portion of the power saving key of the first panel member, as viewed from a rear surface side.

FIG. 6(A) is a top view of the state where the light guide plate 544 is mounted on the circuit board 546, as viewed from the top, FIG. 6(B) is a cross-sectional view showing a part of the first panel member 180, the light guide plate 544, the circuit board 546 and the LEDs 548, when cutting the operation unit 18 at a position shown by a VIB-VIB line in FIG. 6(A), FIG. 6(C) is an illustration view for explaining the second indication portion 542 of the power saving key 54, and FIG. 6(D) is an illustration view viewing the indication portion 54a of the power saving key 54 of the first panel member 180 from the rear surface side. However, in FIG. 6(B) (similarly, FIG. 8(B)), in order to present the second indication portion 542 and a print 550, thickness thereof are made large.

As well shown also in FIG. 6(A) and FIG. 6(B), the light guide plate 544 is arranged between the two LEDs 548 on the upper surface of the circuit board 546 while being placed on the area 546a where the electrodes are provided. Moreover, for example, a plane shape (planer form) of the light guide plate 544 is set into a shape in which a circle indicative of the indication portion 54a of the power saving key 54 is inscribed. Each of the two LEDs 548 is an LED of a side emission type, and emits white visible light, for example. Furthermore, an area or range that the light is emitted from each of the LEDs 548 is a sector shape when viewed from the above. Therefore, it is possible to illuminate at least the indication portion 54a of the power saving key 54 from the bottom.

In addition, although the indication portion 52a of the home key 52 is larger the indication portion 54a of the power saving key 54, since only the portion of the figure indicative of the home key 52 is illuminated by the backlight and this figure is almost the same as the size of the indication portion 54a of the power saving key 54, it is possible to illuminate the figure indicative of the home key 52 by using the same structure as the structure formed by the light guide plate 544, the circuit board 546 and the LEDs 548 that function as the backlight of the power saving key 54.

As shown in FIGS. 6(A), 6(B) and 6(D), the indication portion 54a of the power saving key 54 includes the first indication portion 540 and the second indication portion 542 that is laminated on the first indication portion 540 and indicative of a predetermined figure. In this first embodiment, the second indication portion 542 is provided in the upper surface of the first indication portion 540 in an inside (within a range) of the first indication portion 540. As described above, the color of the first indication portion 540 is a dark color having the light permeability. In this first embodiment, the second indication portion 542 is a print of a moon mark (figure), and is formed as a thin film. As shown in FIG. 6(C), the second indication portion 542 is formed by two layers. In a surface side of the second indication portion 542, a moon mark is printed in silver ink (a first print) 542a, and a moon mark is printed in black ink (a second print) 542b in a rear surface side (beneath the ink 542a) of the second indication portion 542. This black ink 542b does not permeate or hardly permeate the light passing through the first indication portion 540. Therefore, the second indication portion 542 has the light permeability lower than that of the first indication portion 540.

In addition, although the moon mark is printed on the surface side of the second indication portion 542 in silver ink 542a in this first embodiment, it does not need to be limited to this. As other examples, the color may be other metallic colors (color with metallic luster), such as a gold, a platinum color, a copper color, etc. or a color that approximates to these colors. As the color that approximates to the metallic color, yellow, white, bright gray, bright red, etc. correspond.

Furthermore, as shown in FIG. 6(B) and FIG. 6(D), in the rear surface of the first panel member 180, a print (light permeation preventing member) 550 is printed around the indication portion 54a. This print 550 is black ink 542b that does not permeate or hardly permeate the light passing through the first panel member 180. Furthermore, the print 550 is formed in a size that is the same as the opening 182b formed in the second panel member 182 or slightly larger than the opening 182b. Therefore, it is possible to prevent the circumference of the power saving key 54 from becoming bright by the light irradiated from the light guide plate 544.

Figure 7A:
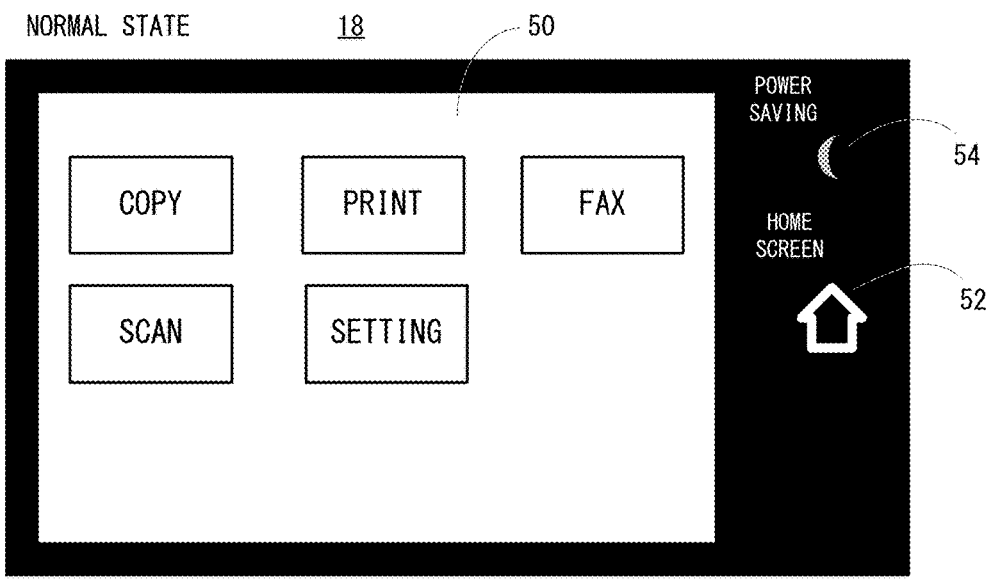
FIG. 7(A) is an illustration view showing an appearance of the upper surface of the operation unit in a normal state.
Figure 7B:
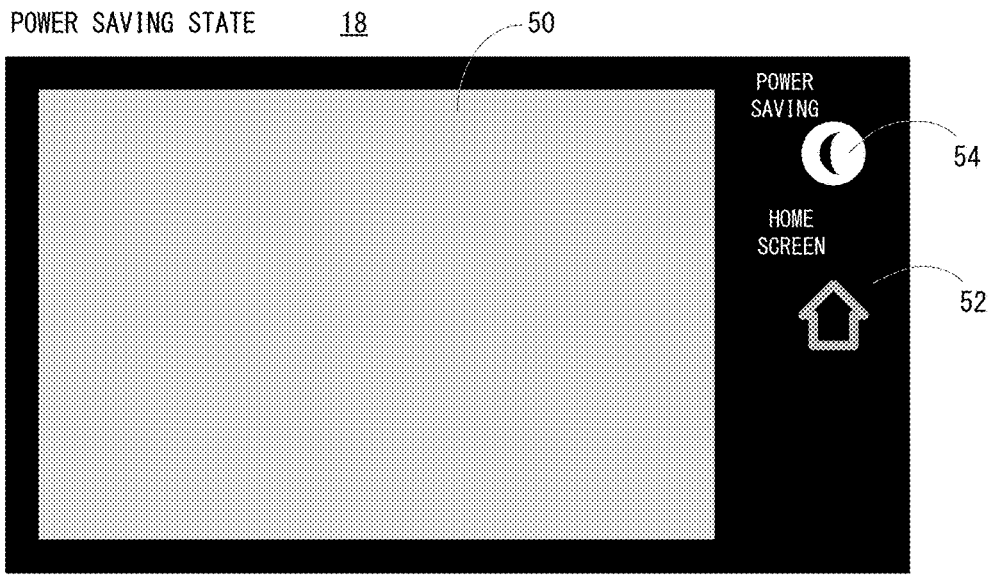
FIG. 7(B) is an illustration view showing the appearance of the upper surface of the operation unit in a power saving state.

FIG. 7(A) is an illustration view showing an appearance of the upper surface of the operation unit 18 in the normal state, and FIG. 7(B) is an illustration view showing an appearance of the upper surface of the operation unit 18 in the power saving state.

As shown in FIG. 7(A), in the normal state, various kinds of screens according to a user's operation are displayed on the touch panel display 50. An example of a home screen is displayed in the example shown in FIG. 7(A). For example, as described above, a plurality of icons for performing each function and setting are displayed in the home screen.

At this time, since the backlight of the home key 52 is lit, the figure indicative of the home key 52 is displayed brightly. On the other hand, since the backlight (LEDs 548) of the power saving key 54 is put out, the first indication portion 540 of the indication portion 54a is dark. However, since the silver ink 542a is printed in the surface side of the second indication portion 542, the second indication portion 542 is brighter than the first indication portion 540. Therefore, the user can recognize easily that it is the power saving key 54 and its position.

In addition, in a case where the second indication portion 542 is not provided, and like the home key 52, the figure indicative of the power saving key 54 in the first indication portion 540 of the first panel member 180 is made colorless transparent or colorless semitransparent, when the backlight is put out, the indication portion 54a of the power saving key 54 becomes near black color entirely and assimilate with the first indication portion 540, and it is difficult to visually recognize it. That is, it is hard to operate it.

On the other hand, as shown in FIG. 7(B), in the power saving state, the backlights of the touch panel display 50 and the home key 52 are put out. In addition, although the touch panel display 50 and the home key 52 are shown in gray in FIG. 7(B) in order to show intelligibly, in fact, the display portion of the touch panel display 50 and a region of the figure of the home key 52 become a color near black, which is a similar color to the surface of the first panel member 180. Therefore, when viewing the operation unit 18 from a slightly distant position, the touch panel display 50 and the home key 52 assimilate to surrounding color and it is difficult to visually recognize them.

Furthermore, in the power saving state, the backlight of the power saving key 54 is lit. Therefore, when the light is irradiated upward from the light guide plate 544, in the indication portion 54a, the light passes through the first indication portion 540 and the first indication portion 540 shines brightly, but the second indication portion 542 does not permeate or hardly permeate the light. Therefore, the second indication portion 542 becomes dark compared with the first indication portion 540. Therefore, the user can recognize easily that it is the power saving key 54 and its position.

Thus, when the backlight of the power saving key 54 is lit or put out, the light and darkness of the first indication portion 540 and the second indication portion 542 are reversed, and the figure (moon mark) indicative of the power saving key 54 becomes conspicuous.

According to the first embodiment, the light and darkness of the first indication portion 540 and the second indication portion 542 are reversed if the backlight of the power saving key 54 is lit or put out, it is possible to visually recognize the figure indicative of the power saving key 54 easily irrespective of lighting or putting out the backlight. Therefore, it is possible to improve operability.

In addition, although the second indication portion 542 of the figure indicative of the power saving key 54 is printed and its surface side is constituted with the silver ink 542a in this first embodiment, may be constituted with the white ink 542a. However, in a case where the silver ink 542a is printed, as compared with a case where the white ink 542a is printed, the silver ink 542a becomes black (dark) when the backlight of the power saving key 54 is lit, and therefore, it is easy to visually recognize it. Furthermore, when bringing the color close to black rather than silver, the ink 542a assimilates to the first indication portion 540 when the backlight is put out, and it is difficult to visually recognize it.

Furthermore, although the second indication portion 542 is constituted by two layers, the silver ink 542a and the black ink 542b in this first embodiment, the same may be constituted only with the silver ink 542a so as not to permeate the light. Even in such a case, it is possible to obtain the effect of the embodiment. For example, the second indication portion 542 may be constituted by printing the silver ink 542a in piles.

Moreover, although the second indication portion 542 is printed on the upper surface of the first panel member 180 in this first embodiment, the second indication portion 542 may be provided in a rear surface (undersurface) of the first panel member 180. In such a case, a portion where the second indication portion 542 is printed in the first panel member 180 is made colorless transparent.

Moreover, although the second indication portion 542 is laminated on the upper surface of the first indication portion 540 in this first embodiment, by providing a concave portion in the upper surface side of the first indication portion 540 and providing (embedding) the second indication portion 542 in this concave portion, lamination may be implemented. However, a concave portion may be provided in the undersurface side of the first indication portion 540, and the second indication portion 542 may be provided in this concave portion.

Furthermore, although the second indication portion 542 is printed on the upper surface of the first panel member 180 in this first embodiment, there is no necessity of being limited to this. A seal member having a surface in silver and a rear surface in black may be adhered. However, the seal member may be constituted so as not to permeate the light or to hardly permeate the light by enlarging the thickness thereof, and then, a seal member having a surface in silver may be adhered to the same. Furthermore, a seal member may be adhered onto the rear surface of the first panel member 180. In such a case, a portion where the seal member is adhered in the first panel member 180 is made colorless transparent. Furthermore, a seal member may be adhered to a concave portion while providing the concave portion in the upper surface or the undersurface of the first indication portion 540.

Second Embodiment

Since an image forming apparatus 10 of the second embodiment is the same as the first embodiment except that an uneven surface is provided in a part of a second operating region R2 of the operation unit 18, a duplicate description will be omitted.

Figure 8A:
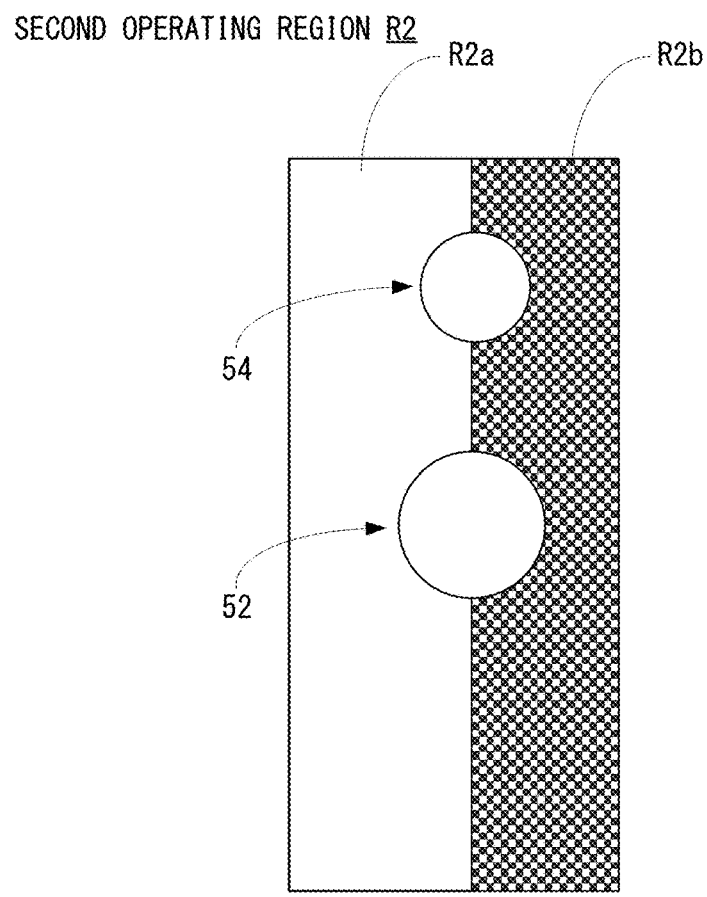
FIG. 8(A) is an illustration view showing a surface of a second operating region of the operation unit in a second embodiment.
Figure 8B:
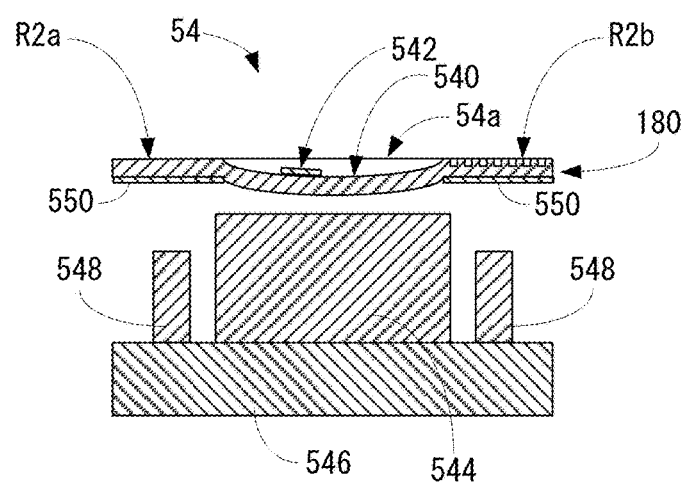
FIG. 8(B) is a cross-sectional view showing a partial cross-section of a portion provided with a power saving key of the operation unit in the second embodiment.

FIG. 8(A) is an illustration view showing a surface of the second operating region R2 of the operation unit 18 in the second embodiment, and FIG. 8(B) is a cross-sectional view showing a partial cross-section of a portion provided with the power saving key 54 of the operation unit 18 in the second embodiment.

As shown in FIG. 8(A), in the second embodiment, a part of the second operating region R2 is made into the uneven surface. In the example shown in FIG. 8(A), in the second operating region R2, a left side region R2a is still a smooth surface and a right side region R2b is made an uneven surface on the basis of the center of the home key 52 and the power saving key 54. For example, unevennesses each being square (quadrate) as viewed from the top are formed in the surface of the region R2b while being aligned in straight lines horizontally and vertically. Therefore, as shown in FIG. 8(B), the surface of the first panel member 180 is made unevenness in a right side of the indication portion 54a of the power saving key 54. However, a shape of a concave or convex viewed from the top may not be square or quadrate. For example, a shape of the concave or convex viewed from the top may be a circle.

A reason why the surface of the right end portion of the operation unit 18 is made in an uneven surface is that the right end portion is a position or region having a high frequency that the user touches in the surface of the operation unit 18 (the panel member 18a), and therefore, in order to prevent dirt, such as finger marks, from adhering in this portion. For example, when the dirt such as finger marks is adhered to the surface of the panel member 18a of the operation unit 18, not only it is unsanitary but an appearance is bad since it seems to have become cloudy white.

Therefore, when preventing adhesion of dirt is only taken into consideration, entire surface of the second operating region R2 may be made into an uneven surface. In this case, the surface of the first operating region R1 (except for the display portion of the touch panel display 50) may be also made into an uneven surface. A reason why only the second operating region R2 is made into an uneven surface in this second embodiment is that it is possible to operate the home key 52 and the power saving key 54 without seeing the second operating region R2 by perceiving a boundary of the region R2a and the region R2b with a tactile sense of fingers, and by moving the finger along the boundary. Therefore, there is no necessity that the boundary of the region R2a and the region R2b is set at the center of the home key 52 and the power saving key 54, and as long as it is on the indication portions 52a and 54a of the home key 52 and the power saving key 54, the boundary may be set in a position other than the center. That is, it is sufficient that at least a part of each of the indication portions 52a and 54a of the home key 52 and the power saving key 54 is included in the uneven surface.

According to the second embodiment, since the uneven surface is provided in a part of the second operating region R2, and a part of each of the indication portions 52a and 54a of the home key 52 and the power saving key 54 is included in the uneven surface, it is possible to prevent dirt, such as finger marks, from adhering, and to improve operability.

Third Embodiment

Since an image forming apparatus 10 of the third embodiment is the same as the second embodiment except that unevennesses of a uneven surface are formed along with curved lines in the surface of the operation unit 18, a duplicate description will be omitted.

Figure 9:
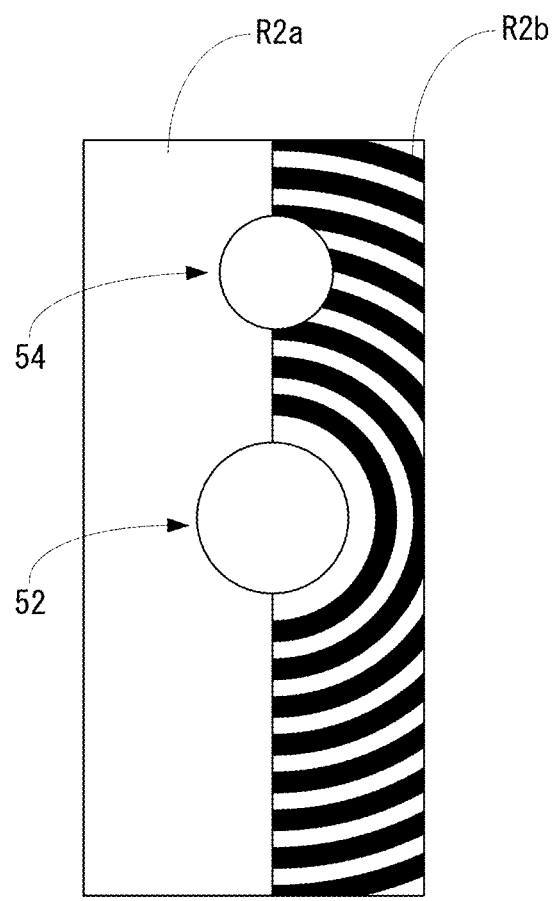
FIG. 9 is an illustration view showing a surface of a second operating region of the operation unit in a third embodiment.

FIG. 9 is an illustration view showing the surface of the second operating region R2 of the operation unit 18 in a third embodiment.

As shown in FIG. 9, in the third embodiment, unevennesses are formed along with a shape of curved lines in the region R2b just like ripples spread centering around the home key 52. However, in FIG. 9, in order to show ripples, details of the unevennesses are omitted. Therefore, it is possible to know the position of the home key 52 even when the backlight of the home key 52 is put out and thus the indication portion 52a of the home key 52 becomes dark, by visually confirming the ripples formed by the unevnenesses.

According to the third embodiment, since the unevenesses are formed in a shape of ripples that spread centering around the home key 52, it is possible to recognize the home key 52 easily by not only touching to the unevenesses but a visual sense.

In addition, although the unevennesses are formed into a shape of ripples centered around the home key 52 in the third embodiment, it does not need to be limited to this. Instead of the home key 52, the unevennesses may be formed in a shape of ripples around centering the power saving key 54. Furthermore, unevennesses in a shape of ripples centered around the home key 52 and unevennesses in a shape of ripples centered around the power saving key 54 may be formed so as not to interfere mutually. In addition, although the image forming apparatus 10 as an example of the electronic equipment comprising the operation unit 18 is described in each of the above-described embodiments, it does not need to be limited to this. The operation unit 18 is applicable as an operation unit of other electronic equipment, such as telephone with a facsimile function, a car-navigation system, a car audio, a component audio, a hard disc recorder, DVD and blue-ray recorder, a smart phone, etc.

It should be noted that the specific structure described in the above-described embodiments are only examples, and to be set or changed appropriately in accordance with the actual products.

It should be noted that the above-described specific embodiments are only examples, and to be changed appropriately in accordance with specifications of the actual products. Although the present invention has been mentioned and illustrated in detail, it is clearly understood that the same is by way of illustration and example only and is not to be taken by way of limitation, the spirit and scope of the present invention being limited only by the terms of the appended claims. Furthermore, it is intended that the scope of the present invention covers all modifications within the meaning and range of equivalency of the claims.

What is claimed is:

1. An operation unit, comprising:
   an indication portion that includes a first indication portion having light permeability and a second indication portion laminated on the first indication portion; and
   an operating portion including the indication portion, wherein
   the operating portion includes a light emitter that is arranged facing a rear surface of the indication portion,
   the second indication portion has no light permeability, and a surface color different from a surface color of the first indication portion, and
   the first indication portion is larger than the second indication portion.

2. The operation unit according to claim 1, wherein a color of the first indication portion is a dark color.

3. The operation unit according to claim 1, wherein a color of the second indication portion is a metallic color or a color that approximates to the metallic color.

4. The operation unit according to claim 3, wherein the color of the second indication portion is silver.

5. The operation unit according to claim 1, wherein a color of a rear surface side of the second indication portion is black.

6. The operation unit according to claim 1, further comprising a light permeation preventing member that is provided in a rear surface side of the indication portion and prevents light irradiated by the light emitter from being permeated around the indication portion.

7. The operation unit according to claim 1, wherein a surface portion of the second indication portion is formed so as to have a height difference with respect to a surface portion of an outer peripheral portion of the second indication portion among the surface of the operation unit.

8. The operation unit according to claim 1, wherein a surface portion of the second indication portion has a depressed shape with respect to a surface of the operation unit.

9. Electronic equipment, comprising the operation unit recited in the claim 1.

* * * * *